United States Patent
Griffin, Jr. et al.

(10) Patent No.: US 6,617,231 B1
(45) Date of Patent: Sep. 9, 2003

(54) METHOD FOR FORMING A METAL EXTRUSION FREE VIA

(75) Inventors: Alfred J. Griffin, Jr., Dallas, TX (US); Antonietta Oliva, San Jose, CA (US); Adel El Sayed, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/091,789

(22) Filed: Mar. 6, 2002

(51) Int. Cl.[7] ............... H01L 21/44; H01L 21/4763
(52) U.S. Cl. ................. 438/597; 438/627; 438/653
(58) Field of Search ....................... 438/597, 627, 438/653

(56) References Cited

U.S. PATENT DOCUMENTS 5,970,378 A * 10/1999 Shue et al.
6,323,120 B1 * 11/2001 Fujikawa et al.
6,404,053 B2 * 6/2002 Givens

* cited by examiner

*Primary Examiner*—John F. Niebling
*Assistant Examiner*—Stanetta Isaac
(74) *Attorney, Agent, or Firm*—Yingsheng Tung; Wade James Brady, III; Frederick J. Telecky, Jr.

(57) ABSTRACT

A process whereby elimination of metal extrusion through the via-barrier layer into the base of etched via holes is accomplished by controlling the process temperature of the via-barrier deposition to less than 400° C., and preferably to about 380° C. By eliminating the cause of metal extrusions, i.e., excessive thermally induced stresses on the metal confined biaxially by the dielectric via walls, the resulting defect-free vias are independent of the barrier thickness. The method is applicable to different metal stacks, and in turn, yield and reliability of the device is significantly enhanced.

2 Claims, 2 Drawing Sheets

METHOD FOR FORMING A METAL EXTRUSION FREE VIA

FIELD OF THE INVENTION

The present invention relates to the manufacture of semiconductor devices, and more particularly to a method for forming vias in semiconductor devices.

BACKGROUND OF THE INVENTION

A continuing trend in semiconductor manufacturing is to make more powerful and complex integrated circuit devices in a smaller area. Manufacturers achieve this objective by making individual feature sizes smaller and by locating these features closer together. Millions of active and passive devices, such as transistors, capacitors, and resistors are formed on a semiconductor substrate, such as silicon. These devices are isolated from each other on the substrate and later are interconnected to form functional circuits. The quality of these interconnecting structures drastically affects the performance, and reliability of the completed circuits.

Often the interconnections are fabricated as a multilayer structure having alternating layers of patterned metal and dielectric materials. The dielectric layers, frequently a form of silicon oxide, serve to separate the conductors, both vertically and horizontally, and very small, vertical metal filled vias provide a means of interconnection between the metal levels. Performance of the interconnections and dielectric must be precise and predictable in order to provide a stable device.

In multilevel structures, the metal conductors may include a base layer, a bulk conductor layer, and a capping layer, and the sum of these layers is referred to as a metal stack. The metal stack is formed on a dielectric layer, typically by sputtering, and then through the use of photolithographic techniques is etched to define the interconnecting structure. Aluminum and aluminum alloys are often used as the bulk conductors in metal stacks.

As a result of the small size and complexity of vias, particularly for 0.35 micron and smaller technology, fabrication and integrity often present a significant challenge to the manufacture, yield, and reliability of modern ultra large scale integrated circuits.

A simplistic via structure, as shown in FIG. 1, typically includes a horizontal metal interconnection layer 101, most frequently comprised of aluminum, copper, or an aluminum alloy, one or more dielectric layers 102, usually some form of silicon dioxide, and a conductive metal plug 103 in the via, such as tungsten (W). In complex devices, the metal level may be comprised of multiple layers of material, including currently popular titanium (Ti) and titanium nitride (TiN) which sandwich the conductive interconnection metal. The layers 104, 105 serve multiple purposes which may include adhesion promotion, antireflection, and an aid in defining grain structures. Also, it has been found that for proper orientation and formation of the TiN layer, it is necessary to first provide a clean surface of a titanium metal layer 105 which acts as a seed layer.

However, due to the interaction of aluminum and/or copper with other materials, a barrier layer 107 is usually provided between the metal interconnection layer and via plug. A typical via-barrier layer 107, such as CVD deposited TiN which conforms to the inner surfaces of the via prior to forming the tungsten plug.

Obviously, misalignment of the metal stack can lead to exposure of the plug metal, and in turn to corrosion during subsequent processing. Poor coverage of the metal by the barrier metal can lead to voids in the interconnection resulting from the tungsten source gas interacting with aluminum. A number of other via failure mechanisms have been disclosed, along with proposed corrective procedures.

A more subtle yield loss related to via integrity has plagued the industry, wherein via resistance may be marginally high, but more importantly an instability in the operating frequency has lead to both yield and operating failures of the device. Such subtle failures are difficult to detect and to control, but stress induced extrusion of aluminum into the via has been identified in "Reflow of AlCu into Vias during CVD TiN Barrier Deposition", A, Oliva, et.al., ISRM2000, and Besser, et al in U.S. Pat. No. 5,789,315 (1998) as one contributor to such device reliability degradation.

A schematic drawing of a metal extrusion failure is illustrated in FIG. 2. The metal conductor 201 having a relatively high coefficient of thermal expansion is constrained and put into a state of compression by the dielectric layers 202 of the via which have a much lower expansion coefficient. During thermal excursions, some of the metal stress may be relieved by an extrusion 206 through the barrier layers 204 into the base of the via. While it is agreed that the failure is related to a thermally induced compressive stress in the metal line which causes the metal to extrude into the via to relieve stress, a clear solution for elimination of the defect has not been previously identified.

SUMMARY OF THE INVENTION

It is an object of the current invention to provide a method for elimination of metal extrusions through the barrier layers of etched via holes in multilevel integrated circuit devices.

It is an object of the invention to identify the root cause of stress induced extrusions into vias, and to provide a method for eliminating the source of the failure.

It is an object of the invention to provide an improved manufacturing process for via barrier formation.

It is an objective of the invention to provide a manufacturing process which does not slow throughput.

It is an object of the invention to provide a manufacturing process for elimination of metal extrusions through the barrier layer, and into the via which is not related, and dependent upon a second variable or process.

It is an object of the invention to provide a method for manufacture of semiconductor devices which improves yield and reliability.

It is an object of the invention to provide a method for elimination of stress induced metal extrusions into vias which is applicable to different metal stacks.

It is further an objective of the invention to provide a method of eliminating stress induced metal extrusions into vias which is not dependent on barrier thickness.

It is an object of the invention to provide an interconnection metallization, including titanium aluminide, wherein good integrity of the via barrier against metal extrusions is exhibited.

The above and other objectives of the invention will be met by disclosing a process whereby metal extrusion through the via barrier layer into the base of an etched via holes is eliminated. Temperature of the in process wafer, and that of the via barrier deposition is controlled at less than 400° C., and preferably to about 380° C., thereby decreasing compressive stresses on the metal at the process step where the failure is manifested.

By eliminating the cause of metal extrusions, i.e., excessive thermally induced stresses on the metal confined biaxially by the dielectric via walls, the resulting defect free vias are independent of the barrier thickness, the method is applicable to different metal stacks, and in turn yield and reliability of the device is significantly enhanced.

DETAILED DESCRIPTION OF THE DRAWINGS

Figure 1:
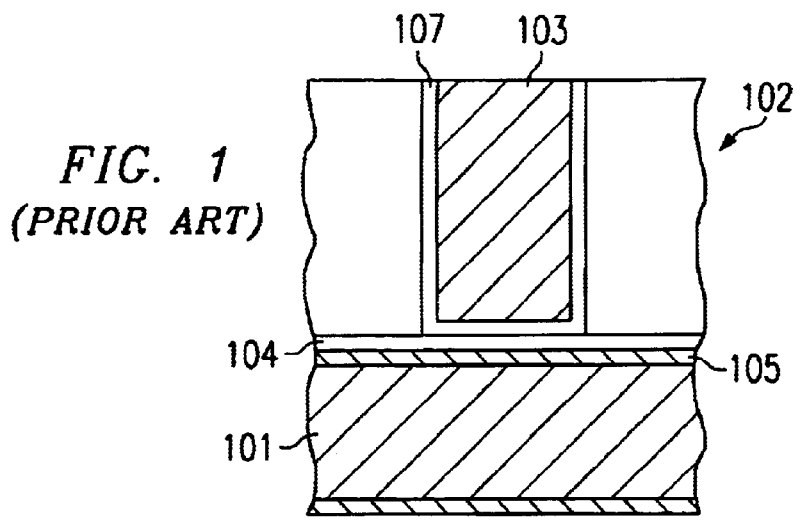
FIG. 1 is a cross sectional view of a via structure. (prior art)
Figure 2:
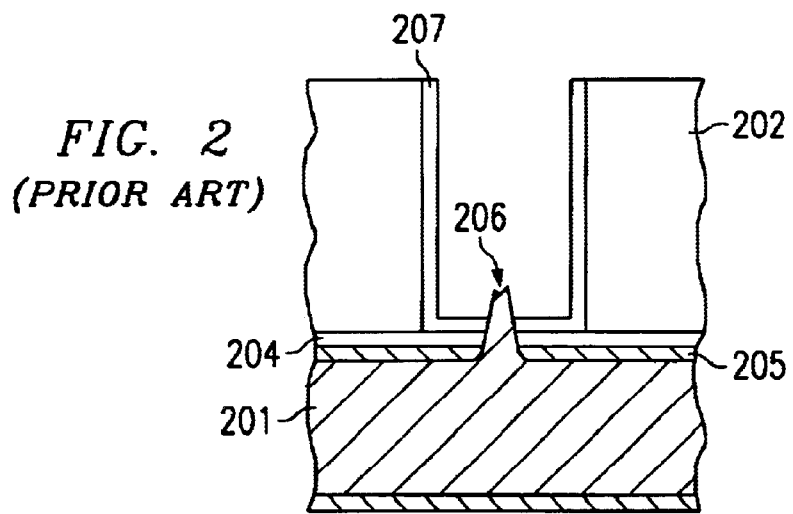
FIG. 2 is a cross section of a via having a metal extrusion through the barrier layers. (Prior art)
Figure 3:
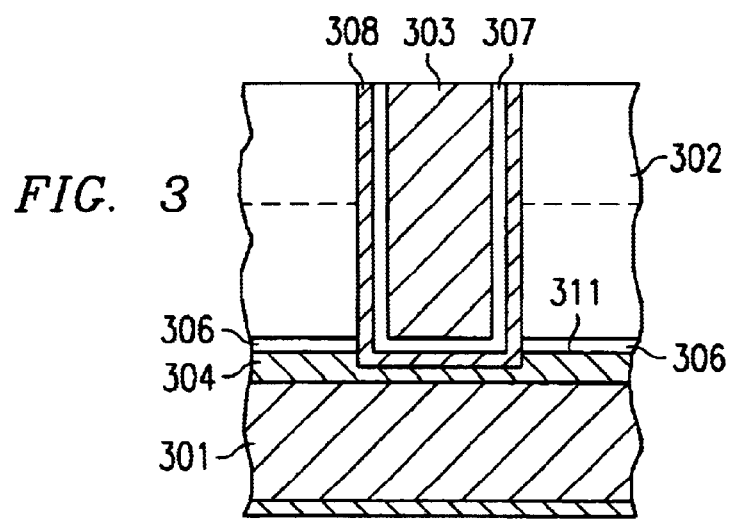
FIG. 3 is a cross section of via of a preferred embodiment of the current invention.

The cross section of a via known to prior art, as illustrated in FIG. 1, is similar to that of the current invention. However, in practice, it should be recognized that the layers are not perfectly smooth, that the thickness of each layer may not be uniform, and that the features may not be as well aligned, as shown. Further, a more detailed look at a cross section of a via of a preferred embodiment of the current invention, as shown in FIG. 3 includes a reacted layer of titanium aluminide 304 in the metal stack. The titanium aluminide, primarily existing as $TiAl_3$, has advantages of serving as a via etch stop, an electromigration resistance improvement, and as a barrier against aluminum extrusions or hillocks. These advantages of the titanium aluminide layer are not novel, and are not a subject of the invention; but integrity of the layer, that of the total via, and of the via barrier against metal extrusions is critical, and is the subject of the invention. Lacking integrity of the reacted metal layer and the via barrier, the metallurgical junctions may be unstable due to the presence of metal extrusions and the aluminide interface. The disturbed interface can react and form voids under the via due to a volume reduction associated with the titanium aluminide reaction. Further, aluminum in the interconnection line can diffuse away from the junction and result in mechanically induced stress migration.

In the preferred embodiment, the metal stack includes the interconnection line 301 of aluminum(Al) doped with copper(Cu), and sandwiched between reactive titanium (Ti) sticking layers. A titanium nitride(TiN) 306 or silicon oxynitride layer on the first surface 311 of the metal stack serves as an anti-reflective coating (ARC).

A sticking layer of titanium 308 lies directly under the CVD deposited titanium nitride via barrier layer 307 which covers both the side walls and bottom of the etched via hole. The via has been patterned and etched into a dielectric material 302, comprised of one or more layers of an oxide. The via hole is filled with a tungsten plug 303.

Figure 4A:
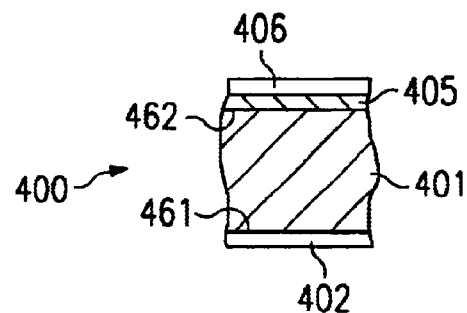
FIG. 4a is a cross section of a metal stack of a preferred embodiment of the current invention.

Process steps involved in via formation for a multilevel integrated circuit device of the current invention are as follows. The metal stack, as shown in FIG. 4a, is deposited on an interlayer dielectric substrate 400. The stack includes a titanium layer 402 of approximately 140 Angstroms thickness on one major surface 461 of the clean, oxide free aluminum alloy layer 401, and about 200 Angstroms of titanium 405 on the second surface 462. A TiN, silicon oxynitride or other antireflective coating (ARC) 406 is deposited atop the exposed surface. The aluminum interconnection line 401 is reacted with a very clean, and oxide free titanium to form a layer of titanium aluminide 412 (FIG. 4b) when annealed at 425° C. The metal stack is patterned and etched using known technology.

Figure 4B:
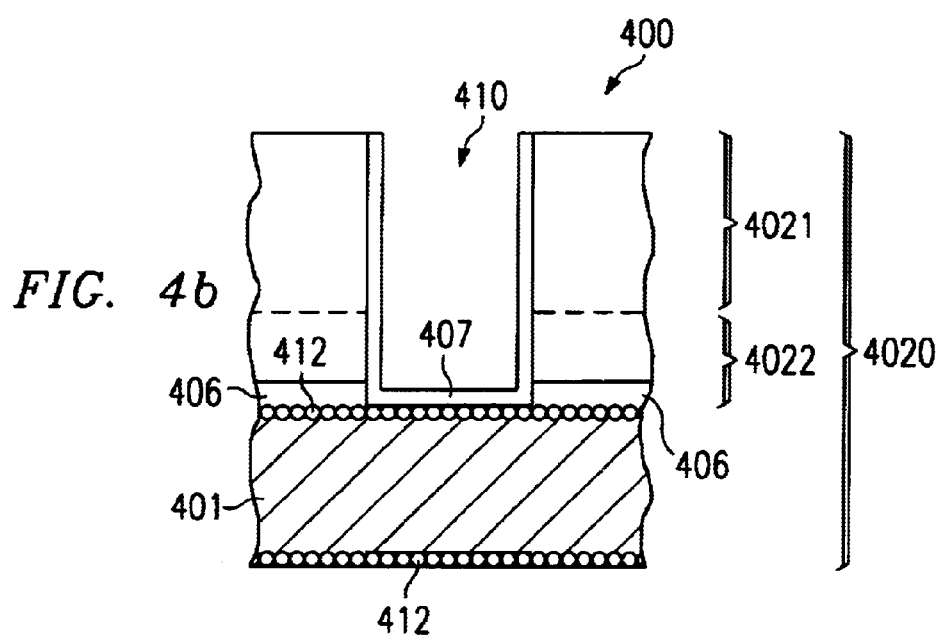
FIG. 4b is a cross section through a reacted metal stack and etched via.

As shown in FIG. 4b, an interlayer dielectric 4020 preferably includes deposited layers of high density plasma (HDP) 4021, and a tetraethyl ortho silicate (TEOS) 4022 oxides which surround the patterned metal line 401. The dielectric is patterned and etched to form a via hold 410 using existing technology, and is subsequently planarized by chemical mechanical polish. A typical metal degas process at 350° C. follows.

Figure 4C:
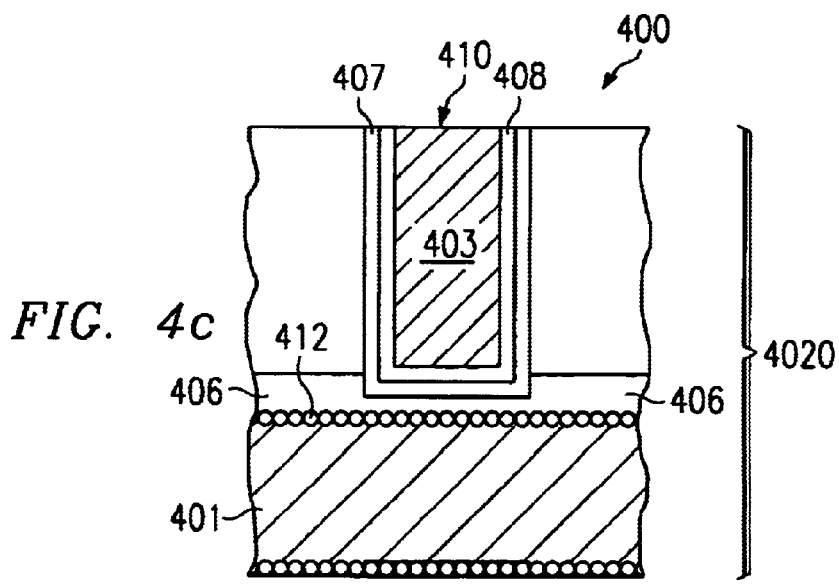
FIG. 4c is a cross section through a reacted metal stack and filled via of the current invention.

In FIG. 4c, a titanium seed layer 408 is deposited at a relatively low temperature in the via, and insitu a TiN film 407 is CVD deposited to provide the via-barrier prior to the via hole being filled with CVD deposited tungsten plug 403.

It is the thermal excursion during high. temperature CVD TiN via-barrier deposition which must be carefully controlled to avoid excessive compressive stress on the metal from breaking through the relatively thin via-barrier layer. According to this invention, temperature of the substrate and of the via-barrier deposition is controlled to about 380° C. for successful elimination of metal extrusion through the barrier. The tungsten plug will confine the metal expansion and preclude extrusion through the via-barrier once it has been deposited.

The process step wherein the metal extrusion into the via occurs has been confirmed by analyses showing Al/Cu, Ti, and F in the anomalous extrusion. Further, transmission electron micrograph (TEM) analyses shows that the titanium layer was underneath the extrusion, indicating that the extrusion occurred during barrier deposition. Further, CVD TiN is found on top of the metal extrusions, thus confirming that extrusions do not occur as a function of the CVD W plug deposition, but do occur during CVD titanium nitride deposition, which typically is a high temperature process.

Therefore, the key to elimination of metal extrusions in etched via holes is to control the process temperatures, so that the relatively high expansion metal is not excessively stressed by the confining low expansion dielectric layers, to the point that the metal breaks through the via-barrier layer prior to filling the via.

Besser and Cheung, U.S. Pat. No. 5,789,315, which is included herein by reference, recognized a significant decrease in stress to near zero on the metal lines if the interlayer oxides were deposited at 380° C. However, they further related the presence of metal extrusions to controlling the metal degas process to a temperature which is lower than that of the oxide deposition. This does not preclude a high level of stress from being introduced during subsequent processes, and in particular, during deposition of the relatively thin via-barrier layer which is the layer violated by the extruded metal.

According to this invention, the deposition temperature of the via-barrier must be controlled to less than 400° C., and preferably to near 380° C. It has been found that at CVD TiN deposition temperature of 400° C., metal extrusions are not entirely eliminated; however, at 380° C. metal extrusions are completely eliminated. Heretofore, CVD deposition temperature of TiN has typically been recommended by reactor manufacturers to be greater than 400° C.

Via test structures which allow resistance measurement of single vias have been used to quantify the impact of reduction in titanium nitride via barrier deposition temperature to approximately 380° C. Based on parametric data from a large number of process lots comparing the via barrier deposition temperature, the resistance of those test devices having via barrier deposition at 380° C. were near the target value, with no out of range values, whereas the devices processed at greater than 400° C. had a lower probability of meeting the target value, and had a number of devices outside the acceptable range.

The preferred embodiment of this invention includes CVD deposition of TiN via-barrier within the range of 380° C. to 390° C. This process has been accomplished without decreasing the reactor throughput by reducing preheat time. Substrate temperature control, and reduction in preheat time are assisted by incorporating a heated $N_2$ gas impingement of the wafer backside. The preheat technique is not a subject of the current invention, and alternate techniques may be equally effective in speeding the reactor throughput. This technique is offered as one example.

The controlled temperature via-barrier process is described with respect to a preferred embodiment, however it should be recognized that it is applicable to alternate metallization stacks, including among others Ti/TiN, TiN, TiN/Ti on both conductor surfaces. The invention is not restricted to a given barrier thickness, but further, it is applicable to a variety of different materials, and via configurations.

For the specific via-barrier deposition temperature of 380° C., it is expected that the interconnection metals of choice will be high expansion materials such as aluminum, having a thermal coefficient of expansion (CTE) of about 26 PPM, copper of about 17 PPM, or various alloys thereof, which are considerably more thermally expansive than silicon and silicon dioxide having CTE in the range of 2.2 to 2.5 PPM. For alternate material combinations, the deposition temperature of the via-barrier would be controlled to one wherein the metal stress level approaches zero.

Thicker via barrier layers may add a margin of safety to the process, but are not a cure for aluminum extrusion into the via, whereas controlling the deposition temperature of the via-barrier eliminates the cause, and thus provides a process for avoiding the presence of metal extrusions into the via hole.

Many variations and modifications of the described embodiments will become apparent to those skilled in the art; it is therefore, the intent that the intended claims be interpreted as broadly as possible in view of prior art in order to include all such variations.

What is claimed is:

1. A method for making a multilevel integrated circuit device free of metal extrusions into a via including the steps of:

providing a semiconductor substrate having a dielectric layer, depositing a metal stack including a conductive layer of an aluminum alloy sandwiched between layers of titanium, and titanium nitride in various combinations thereof, patterning and etching to form interconnection lines, depositing one or more dielectric layers, patterning and etching the dielectric to form a via hole to contact an interconnection line, depositing a seed layer and a via-barrier layer at a controlled temperature, low enough to substantially eliminate deformation on the metal interconnection line, and filling the via hole with a metal plug.

2. A method for making a multilevel integrated circuit device free of metal extrusions into a via including the steps of:

providing a semiconductor substrate having a dielectric layer, depositing a metal stack including reacted titanium aluminide, patterning and etching to form interconnection lines, depositing one or more dielectric layers, patterning and etching the dielectric to form a via hole to contact an interconnection line, depositing a seed layer and a via-barrier layer at a controlled temperature, low enough to substantially eliminate deformation on the metal interconnection line, and filling the via hole with a metal plug.

* * * * *